United States Patent
Park et al.

(10) Patent No.: US 7,408,230 B2
(45) Date of Patent: Aug. 5, 2008

(54) EEPROM DEVICE HAVING FIRST AND SECOND DOPED REGIONS THAT INCREASE AN EFFECTIVE CHANNEL LENGTH

(75) Inventors: Ji-Hoon Park, Seoul (KR); Sung-Taeg Kang, Seoul (KR); Seong-Gyun Kim, Seongnam-si (KR); Bo-Young Seo, Anyang-si (KR); Sung-Woo Park, Gunpo-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 125 days.

(21) Appl. No.: 11/087,127

(22) Filed: Mar. 23, 2005

(65) Prior Publication Data

US 2006/0006452 A1    Jan. 12, 2006

(30) Foreign Application Priority Data

Jul. 6, 2004    (KR) ...................... 10-2004-0052311

(51) Int. Cl.
- *H01L 29/76* (2006.01)
- *H01L 29/94* (2006.01)
- *H01L 31/062* (2006.01)
- *H01L 31/113* (2006.01)
- *H01L 31/119* (2006.01)
- *H01L 29/788* (2006.01)

(52) U.S. Cl. .................. 257/390; 257/314; 257/316; 257/391; 257/401

(58) Field of Classification Search ................. 257/314, 257/316, 390–391, 401
See application file for complete search history.

(56) References Cited

U.S. PATENT DOCUMENTS

| | | | | |
|---|---|---|---|---|
| 5,189,497 A | * | 2/1993 | Komori et al. ............... 257/314 |
| 5,243,210 A | * | 9/1993 | Naruke ........................ 257/320 |
| 5,272,098 A | * | 12/1993 | Smayling et al. ............ 438/268 |
| 5,300,803 A | * | 4/1994 | Liu ............................. 257/322 |
| 5,371,027 A | * | 12/1994 | Walker et al. ................ 438/264 |
| 5,726,470 A | * | 3/1998 | Sato ............................. 257/316 |
| 5,780,893 A | * | 7/1998 | Sugaya ........................ 257/318 |
| 5,894,147 A | * | 4/1999 | Cacharelis ................... 257/316 |
| 5,960,283 A | * | 9/1999 | Sato ............................. 438/257 |
| 5,994,733 A | * | 11/1999 | Nishioka et al. ............. 257/316 |

(Continued)

FOREIGN PATENT DOCUMENTS

JP    2002-305260    10/2002

(Continued)

*Primary Examiner*—Ida M Soward
(74) *Attorney, Agent, or Firm*—F. Chau & Assoc., LLC

(57) ABSTRACT

Provided is an EEPROM device and a method of manufacturing the same. The EEPROM device is composed of one cell including a memory transistor and a selection transistor located in series on a semiconductor substrate, and includes a source region located on a side region of a memory transistor, a drain region located on one side region of the selection transistor facing the source region, and a floating junction region formed between the memory transistor and the selection transistor, wherein the floating junction region includes a first doped region extended toward the source region under a region occupied by the memory transistor and a second doped region doped with the opposite conductive dopant to the first doped region and formed to surround the first doped region.

8 Claims, 5 Drawing Sheets

U.S. PATENT DOCUMENTS

| | | | | |
|---|---|---|---|---|
| 6,232,182 B1 * | 5/2001 | Sugaya | ................ | 438/258 |
| 6,255,163 B1 * | 7/2001 | Zatelli et al. | ................ | 438/257 |
| 6,258,668 B1 * | 7/2001 | Lee et al. | ................ | 438/262 |
| 6,274,907 B1 * | 8/2001 | Nakagawa | ................ | 257/354 |
| 6,420,769 B2 * | 7/2002 | Patelmo et al. | ................ | 257/500 |
| 6,657,249 B2 * | 12/2003 | Nishioka et al. | ................ | 257/315 |
| 6,765,258 B1 * | 7/2004 | Wu | ................ | 257/315 |
| 6,856,001 B2 * | 2/2005 | Rhodes | ................ | 257/519 |
| 6,891,221 B2 * | 5/2005 | Lee et al. | ................ | 257/318 |
| 6,943,071 B2 * | 9/2005 | Fazio et al. | ................ | 438/201 |
| 6,967,133 B2 * | 11/2005 | Amon et al. | ................ | 438/230 |
| 2002/0040993 A1 * | 4/2002 | Patelmo et al. | ................ | 257/315 |
| 2002/0153546 A1 * | 10/2002 | Verhaar | ................ | 257/296 |
| 2002/0158285 A1 * | 10/2002 | Clementi et al. | ................ | 257/316 |
| 2004/0017722 A1 * | 1/2004 | Cavaleri et al. | ................ | 365/222 |
| 2004/0099860 A1 * | 5/2004 | Doris et al. | ................ | 257/19 |
| 2004/0256658 A1 * | 12/2004 | Park et al. | ................ | 257/315 |
| 2005/0051835 A1 * | 3/2005 | Kang et al. | ................ | 257/315 |
| 2006/0076607 A1 * | 4/2006 | Kang | ................ | 257/315 |

FOREIGN PATENT DOCUMENTS

KR    10-20030001096 A    1/2003

\* cited by examiner

EEPROM DEVICE HAVING FIRST AND SECOND DOPED REGIONS THAT INCREASE AN EFFECTIVE CHANNEL LENGTH

CROSS-REFERENCE TO RELATED APPLICATIONS

This application claims the priority under 35 U.S.C. § 119 to Korean Patent Application No. 10-2004-0052311, filed on Jul. 6, 2004, in the Korean Intellectual Property Office, the disclosure of which is incorporated by reference herein in its entirety.

BACKGROUND OF THE INVENTION

1. Field of the Invention

The present invention relates to a nonvolatile memory device, and more particularly, to electrically erasable and programmable read only memory (EEPROM) devices having a junction structure that can compensate for the reduction of effective channel length.

2. Description of the Related Art

A nonvolatile memory device is a memory device that maintains stored data in memory cells even if power is removed. Several types of nonvolatile memory devices are available, and an example of a memory device in which data can be programmed and erased electrically is an EEPROM device.

Several types of EEPROM cell structure are known. One example is a memory cell structure containing a selection transistor in series with a memory transistor. The memory transistor can be configured to include a floating gate and a tunnel dielectric (or tunnel oxide) layer.

FIG. 1 is a plan view illustrating the cell structure of a conventional EEPROM device. FIG. 2 is a cross-sectional view of a conventional EEPROM device along a bit line.

In FIGS. 1 and 2, a conventional EEPROM device includes a memory cell composed of a memory transistor 20 on a semiconductor substrate 10 and a selection transistor 30 for selecting the memory transistor 20.

For example, an active region 11 is formed on the semiconductor substrate 10 formed of p-type silicon, and a gate dielectric layer 21 and a tunnel dielectric layer 23 are formed on the active region 11. The tunnel dielectric layer 23 is formed of material such as an oxide layer and is thinner than the gate dielectric layer 21.

A first gate stack 25 and 27 of the memory transistor 20 is formed by sequentially stacking a floating gate 25, an interlayer dielectric layer 29, and a control gate 27 on the tunnel and gate dielectric layers 21 and 23. The floating gates 25 are formed in a floating or a separated island by separating them from each other along a mask pattern 70.

A source region 41 having a lightly doped drain (LDD) is formed on an active region 11 adjacent to the first gate stack 25 and 27. An insulating spacer 51 can be formed on the side wall of the first gate stack 25 and 27 to form the source region 41 in the LDD structure. Junction regions 43 and 45 can be formed on the active region 11 opposite the source region 41. Here, the structure of junction regions 43 and 45 can be understood to be a floating junction region.

As depicted in FIG. 2, a first doped region 43 doped at a relatively high concentration, such as $n^+$, is extended under the tunnel dielectric layer 23 and located on a region opposite the source region 41 facing the n-type source region 41. The first doped region 43 is formed within the region of the first gate stack 25 and 27. As depicted in FIG. 2, a second doped region 45 doped at a relatively low concentration, such as n-typed region, can be formed in the active region 11 exposed to the first gate stack opposite to the source region 41.

The memory transistor 20 may be formed to include the gate dielectric layer 21, the tunnel dielectric layer 23, the floating gate 25, the interlayer dielectric layer 29, the control gate 27, the source region 41, the first doped region 43, and the second doped region 45.

As depicted in FIG. 2, a second gate stack 35 and 37 adjacent to the second doped region 45 of the junction region structure 43 and 45 is formed to connect the memory transistor 20 in series, and a selection transistor 30 that includes an $n^-$type drain region 47 is formed on the active region 11 opposite the second doped region 45. The first gate 35 and the second gate 37 of the selection transistor 30 are formed together corresponding respectively to the floating gate 25 and the control gate 27.

A bit line 65 extending orthogonal to the first and second gates 35 and 37 of the selection transistor 30 which is used as a word line is electrically connected to the drain region 47. The bit line 65 is electrically connected to the drain region 47 via a bit line contact 61 that passes through an insulating layer 55. Also, the control gate 27 of the memory transistor 20 is used as a sensing line.

However, in the conventional EEPROM device depicted in FIGS. 1 and 2, as the memory capacity increases, the size of a unit cell decreases. If the size of the cell is reduced, the cell characteristics degrade. As a result, punch through may harmfully occur. As the size of the cell decreases, the gate length of the memory transistor 20 and/or the selection transistor 30 is reduced, that is, the length of a channel is reduced. Therefore, punch through can occur by connecting the depletion layers of two junctions separated by the gate, such as the source region 41 and the first doped region 43, or the second doped region 45 and the drain region 47.

To solve the punch through problem, a method is provided to compensate for the length reduction of the effective gate channel due to the length reduction of the gate. To compensate for the reduced effective channel length, changing the ion implantation energy condition or ion implantation dose for junctions 41, 43, 45 and 47 may be necessary. However, the conventional junction structures as depicted in FIGS. 1 and 2 simply show that changing the implantation energy or dose of ions has limited effect of compensating for the length reduction of the effective channel length due to the length reduction of the gate.

SUMMARY OF THE INVENTION

The present invention provides an EEPROM device having a junction structure that can improve cell characteristics by compensating for the length reduction of an effective gate due to the shrinkage cell size of the EEPROM device, and a method of manufacturing the same.

According to an aspect of the present invention, there is provided an EEPROM device comprising: a first gate stack of a memory transistor that includes a tunnel dielectric layer formed on the semiconductor substrate, a gate dielectric layer that surrounds the tunnel dielectric layer, a floating gate formed on the tunnel dielectric layer and the gate dielectric layer, and a control gate formed on the floating gate and an interlayer dielectric layer interposed therebetween; a second gate stack of a selection transistor adjacent to the first gate stack on the semiconductor substrate; a source region formed on a region of the semiconductor substrate located on the opposite side to the second gate stack and adjacent to the floating gate; a drain region formed on a region of the semiconductor substrate located on the opposite side to the first gate stack and adjacent to the second gate stack; a first doped region, one end of which is extended facing the drain region and the other end of which is extended to a region toward the source region passing under the tunnel dielectric layer and formed on the semiconductor substrate between the floating gate stack and the second gate stack; and a second doped region formed to surround the first doped region and doped with the opposite conductive type dopant to the first doped region.

The tunnel dielectric layer can be thinner than the gate dielectric layer.

Here, the first doped region can be an $n^+$ dopant region. The second doped region can be a $p^-$ dopant region that surrounds the $n^+$ dopant region.

The second gate stack of the selection transistor can include a second gate dielectric layer formed at substantially the same time as the gate dielectric layer, a first gate formed at substantially the same time as the floating gate on the second gate dielectric layer, and a second gate formed at substantially the same time as the control gate on the first gate by forming a second interlayer dielectric layer between the first gate.

According to another aspect of the present invention, there is provided a method of manufacturing an EEPROM device, comprising: forming a gate dielectric layer on a semiconductor substrate; forming an ion implantation mask on the gate dielectric layer; forming a second doped region by ion implanting a second dopant on a region exposed by the ion implantation mask on the semiconductor substrate; forming a first doped region, which is surrounded by the second doped region, by ion implanting a first conductive type dopant which is the opposite conductive type dopant to the second dopant in the second doped region; forming a first gate stack of the memory transistor, a portion of which overlaps the floating junction region and a second gate stack of the selection transistor, a side surface of which is arranged on the floating junction region and separated from the first gate stack, wherein the second gate stack is formed parallel to the first gate stack on the gate dielectric layer; and forming a source region on a region of the semiconductor substrate facing the second gate stack and adjacent to the first gate stack and a drain region on a region of the semiconductor substrate facing the first gate stack and adjacent to the second gate stack.

Here, forming the first doped region can be performed by using an ion implantation mask as a selective ion implantation mask and forming the second doped region can be performed by slope ion implantation using the ion implantation mask.

The method of manufacturing the EEPROM device can further include exposing the surface of the semiconductor substrate by selectively removing a portion of the gate dielectric layer after forming the first doped region, and selectively forming a thinner tunnel dielectric layer than the gate dielectric layer on the exposed surface of the semiconductor substrate, wherein the tunnel dielectric layer is located in the first doped region.

The source region can be formed by selectively ion implanting the n-type dopant that is aligned to one side of the first gate opposite to the first doped region, and the drain region can be formed by selectively ion implanting the n-type dopant that is aligned to one side of the second gate opposite to the first doped region.

The present invention solves the problem of reducing the effective channel length of a memory transistor and a selection transistor due to the reduction of cell size, by forming a floating junction structure of a first doped region and a second doped region that surrounds the first doped region.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE PREFERRED EMBODIMENTS

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

One embodiment of the present invention is a method of improving the junction structures for transistors that constitute the EEPROM cell to solve certain problems of cell characteristics caused by the reduction of cell size of an EEPROM device. Particularly, the present invention provides a method of improving the junction structure doped in an active region, such as a structure of a floating junction region, between a memory transistor that constitutes the cell of the EEPROM cell and a selection transistor. The present invention provides a method of forming junction structures, such as a first doped region doped with a first conductive type dopant and a second doped region doped with a second conductive type dopant, which is opposite to the first conductive type dopant and formed to surround the first doped region under a gate of the memory transistor and a gate of the selection transistor.

The first doped region is doped with an $n^+$ conductive type dopant and extends from the region under the gate of the memory transistor to the region under the gate of the selection transistor. The second doped region is doped with a $p^-$ conductive type and surrounds the first doped region. This junction structure is substantially a floating junction that is positioned opposite a source region of the memory transistor and also is positioned opposite a drain region of the selection transistor. Further, the first doped region can be extended toward the source region passing through under the region of a tunnel dielectric layer of the memory transistor.

The problems accompanied by reducing the effective channel length due to the shrinkage of the cell size can be solved by positioning the junction structure of the first doped region to be surrounded by the second doped region. That is, the junction structure proposed in the present embodiment provides that the second doped region, which is doped with the opposite dopant to that of the first doped region, can confine the thickness or the width of a depletion layer generated from the junction of the first doped region. Accordingly, this structure can increase the effective channel length of the memory transistor and the selection transistor, since the thickness and width of the depletion layer generated from the junction of the first doped region can be confined to a thinner or narrower state.

Figure 1:
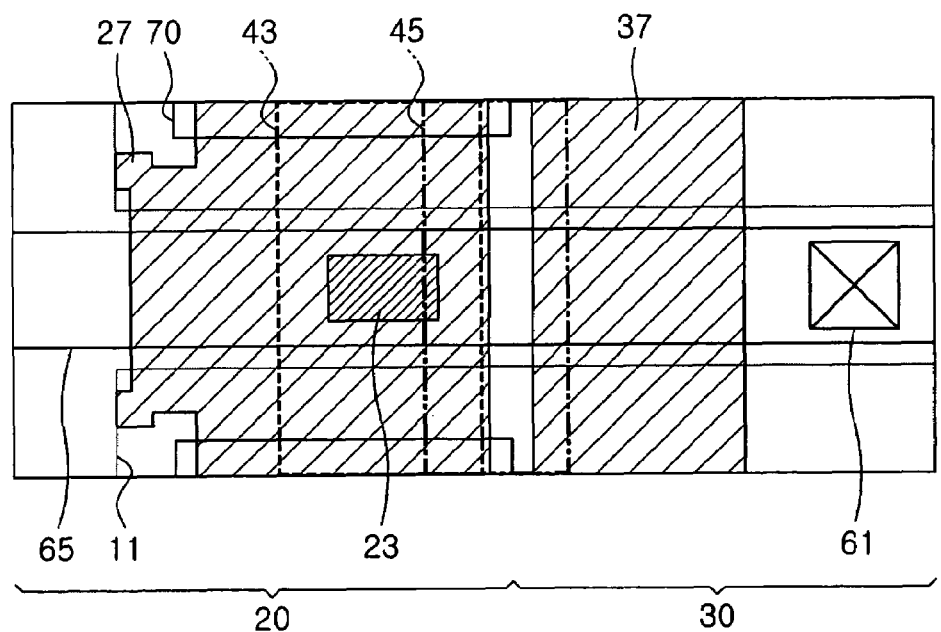
FIG. 1 is a plan view of the cell structure of a conventional EEPROM device.
Figure 2:
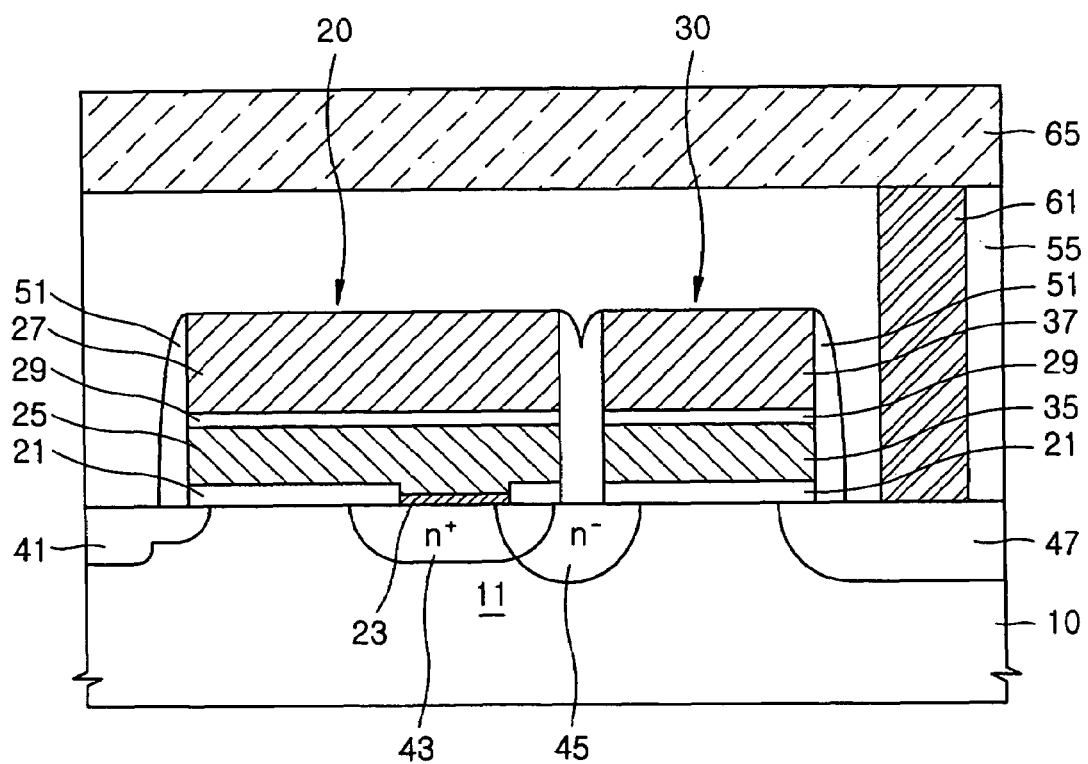
FIG. 2 is a cross-sectional view of a conventional EEPROM device along a bit line.
Figure 3:
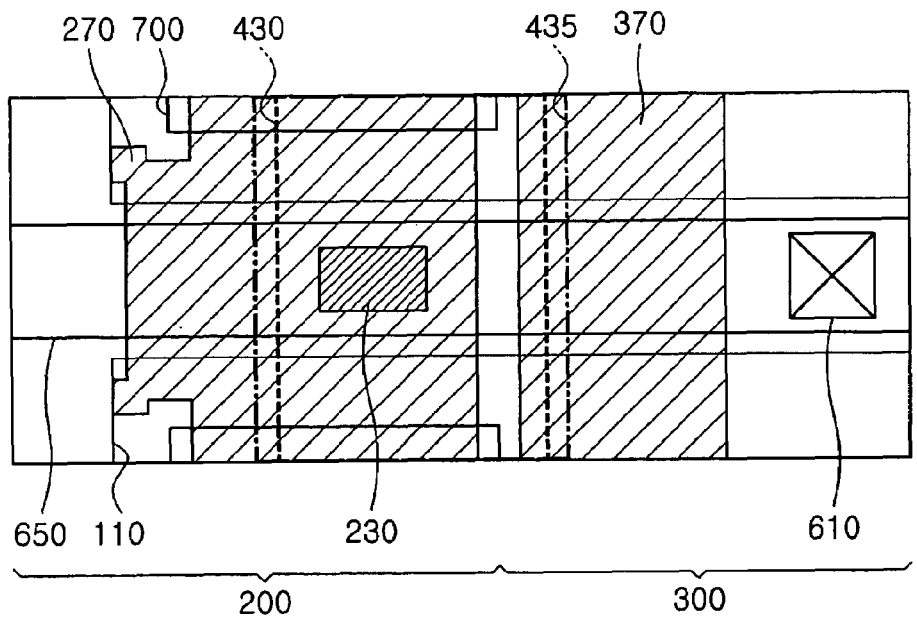
FIG. 3 is a plan view of the cell structure of an EEPROM device according to an embodiment of the present invention.
Figure 4:
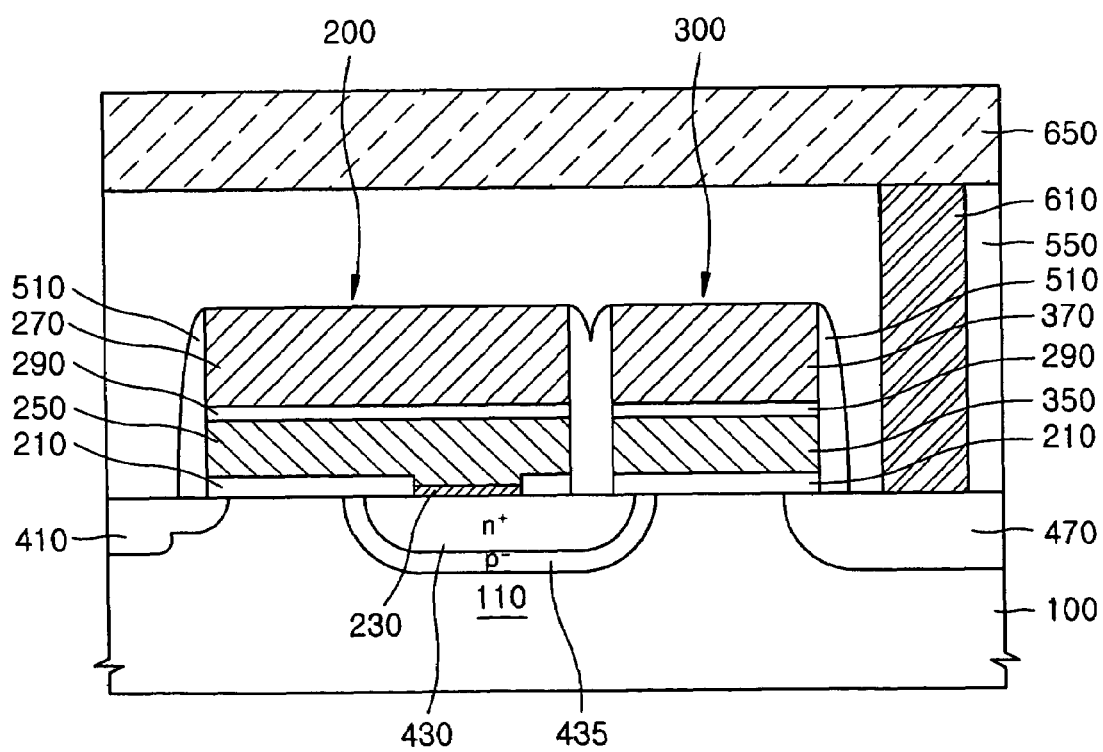
FIG. 4 is a cross-sectional view of an EEPROM device along a bit line, according to an embodiment of the present invention.

FIG. 3 is a plan view of the cell structure of an EEPROM device according to an embodiment of the present invention. FIG. 4 is a cross-sectional view of the cell structure of an EEPROM device along a bit line according to an embodiment of the present invention.

Referring to FIGS. 3 and 4, an EEPROM device according to an embodiment of the present invention includes a floating junction region in an active region 110 of a p-type semiconductor substrate, between a memory transistor 200 and a selection transistor 300. The floating junction region is a first doped region 430 doped with an $n^+$ conductive dopant. One end of the first doped region 430 is extended to overlap gates 350 and 370 of the selection transistor 300, and the other end is extended to overlap gates 250 and 270 of the memory transistor 200 and pass under a tunnel dielectric layer 230.

The first doped region 430 is used as the floating junction region, and can be understood to be a buried layer since the first doped region 430 is extended under the tunnel dielectric layer 230 as it is buried. As depicted in FIG. 4, the first doped region 430 is surrounded by a second doped region 435 that confines the depth (or thickness) and/or width of the first doped region 430.

The second doped region 435 is a doped layer with the same type conductive dopant as the active region 110 of the semiconductor substrate 100, and can be doped with a p-type dopant. The second doped region 435 provides the same effect of increasing the concentration of p-type conductive dopant in a portion of the active region 110 of a peripheral region of the first doped region 430, because the concentration of the p-type conductive dopant in the second doped region 435 is greater than in the active region 110 of the semiconductor substrate 100.

Accordingly, the second doped region 435 confines the thickness and/or width of the first doped region 430. Also, the second doped region 435 has the effect of suppressing the depletion layer generated at the junction interface of the first doped region 430, that is, the effect of confining the thickness of the depletion layer at the junction. Therefore, this structure effectively extends the channel length, i.e., the effect of increasing the length of the effective channel of the memory transistor 200 and/or the selection transistor 300.

In order to form the memory transistor 200, an active region 110 is defined on the p-type semiconductor substrate 100, and dielectric layers, such as oxide layers, i.e., a gate dielectric layer 210 and a tunnel dielectric layer 230, are formed on the active region 110. As depicted in FIG. 3 and 4, the tunnel dielectric layer 230 is formed of a dielectric layer, such as an oxide layer, and the tunnel dielectric layer 230 is generally thinner than the gate dielectric layer 210. The tunnel dielectric layer 230 is formed as thin as possible so that electrons can charge the floating gate 250 from the source region 410 by tunneling through.

A first gate stack of the memory transistor 200 is formed by stacking the floating gate 250 and the control gate 270 on the dielectric layers 210 and 230. At this time, an interlayer dielectric layer 290 is interposed between the floating gate 250 and the control gate 270 for charge coupling.

The source region 410 having an LDD structure is formed on a portion of the active region 110 adjacent to the first gate stack 250 and 270. To form the source region 410 in the LDD structure, a spacer 510 formed of an insulating layer may be formed on the side wall of the first gate stack 250 and 270. The source region 410 may be formed in the LDD structure of $n^-$ dopant region/$n^+$ dopant region, and the $n^-$ dopant region may be extended to a region under the floating gate 250 and may face the first doped region 430 of the floating junction. Here, the thickness (or depth) of the source region 410 may be substantially equal to that of the first doped region 430 of the floating junction.

This method is used to form the memory transistor 200 that includes a gate dielectric layer 210, the tunnel dielectric layer 230, the floating gate 250, the interlayer dielectric layer 290, the control gate 270, the source region 410, the first doped region 430, and the second doped region 435. The floating gate 250 is formed as a floating or a separated island, separated from other floating gates along a floating gate separation mask pattern 700.

As depicted in FIG. 4, the second gate stack 350 and 370 adjacent to the first and second doped regions 430 and 435 of the floating junction is formed, connected in series to the memory transistor 200. The drain region 470 of the selection transistor 300 is formed in a portion of the active region 110 adjacent to the second gate stack 350 and 370 and opposite the source region 410, as an $n^+$ conductive dopant doping region. The drain region 470 can be formed in a multiple dopant region structure, such as a double doped drain (DDD) structure, and the depth (or thickness) of the drain region 470 may be greater than that of the first doped region 430.

The first gate 350 and the second gate 370 are formed substantially simultaneously with the floating gate 250 and the control gate 270 of the memory transistor 200, to correspond to the floating gate 250 and the control gate 270 of the memory transistor 200.

A bit line 650 extending orthogonal to the gates 350 and 370 of the selection transistor 300, which is used as a word line, is electrically connected to the drain region 470. The bit line 650 is electrically connected to the drain region 470 via the bit line contact 610 that passes through the insulating layer 550. Also, the control gate 270 of the memory transistor 200 is used as a sensing line.

Practically, each EEPROM cell is composed of one memory transistor 200 and one selection transistor 300. The memory transistor 200 retains a data level of "1" or "0", and the selection transistor 300 selects memory bits. The memory transistor 200 is electrically connected in series with the selection transistor 300 via the first doped region 430, i.e., floating junction region.

The operation of erasing and programming the above EEPROM cell will now be described.

To erase data in the EEPROM cell, a high bias voltage of from about 15 to about 20V is applied to the gates of the memory transistor 200 and the selection transistor 300, and a floating or 0V is applied to the bit line (drain region) 470 and the common source region 410. In this case, the threshold voltage (Vth) of the memory transistor 200 is increased to from about 3 to about 7 V by charging electrons in the floating gate 250.

To program data in the EEPROM cell, 0 V is applied to the gate of the memory transistor 200 and from about 15 to about 20 V is applied to the gate of the selection transistor 300 and the bit line (drain region) 470, and the common source region 410 is floated. Then, electrons in the floating gate 250 are discharged and the threshold voltage (Vth) of the memory transistor 200 is reduced to from about −4V to about 0V.

As depicted in FIGS. 3 and 4, the EEPROM device according to the present embodiment includes largely three kinds of junction. That is, the source region 410 used as a common source, the first and second doped region structure 430 and 435, and the drain region 470.

Especially, the first and second doped region structure 430 and 435 can be formed by slope ion implantation with a p-type conductive dopants before $n^+$ ion implantation for forming the first doped region 430. That is, a double layered of structure junction is formed, in which a $p^-$ region surrounds the $n^+$ region doped of As or P ions. The source of the p-ions can be in the form of $PH_3$. Here, the ion implanted region can be extended to the region under the gates 350 and 370 of the selection transistor 300.

FIGS. 5 through 10 are cross-sectional views illustrating a method of manufacturing the EEPROM device according to the embodiment of the present invention.

Figure 5:
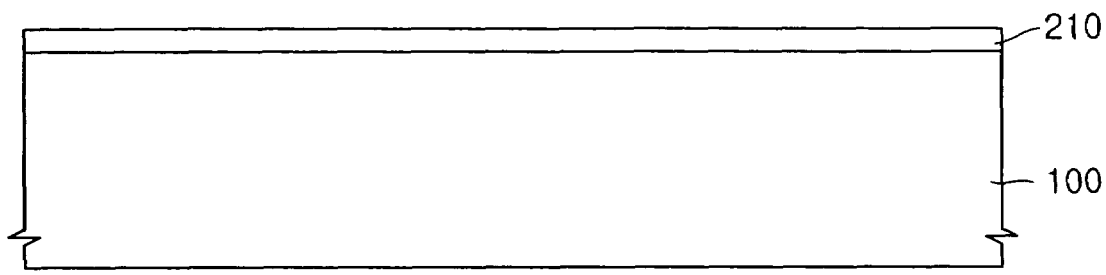
FIG. 5 is a cross-sectional view illustrating forming a gate dielectric layer on a semiconductor substrate according to an embodiment of the present invention.

FIG. 5 is a cross-sectional view illustrating the operation of forming a gate dielectric layer on a semiconductor substrate according to an embodiment of the present invention. Referring to FIG. 5, the active region 110 is defined by a shallow trench isolation (STI) process on the p-type semiconductor substrate 100. The gate dielectric layer 210 is formed by growing or depositing an oxide layer on the entire surface of the active region 110 of the semiconductor substrate 100. The gate dielectric layer 210 is formed of a dielectric material such as an oxide layer and is used for forming a memory gate dielectric layer of the memory transistor 200 and a selective gate dielectric layer of the selection transistor 300. The gate dielectric layer 210 can be an oxide layer formed to a thickness of from about 250 to about 280 Å using a thermal oxidation method.

Figure 6:
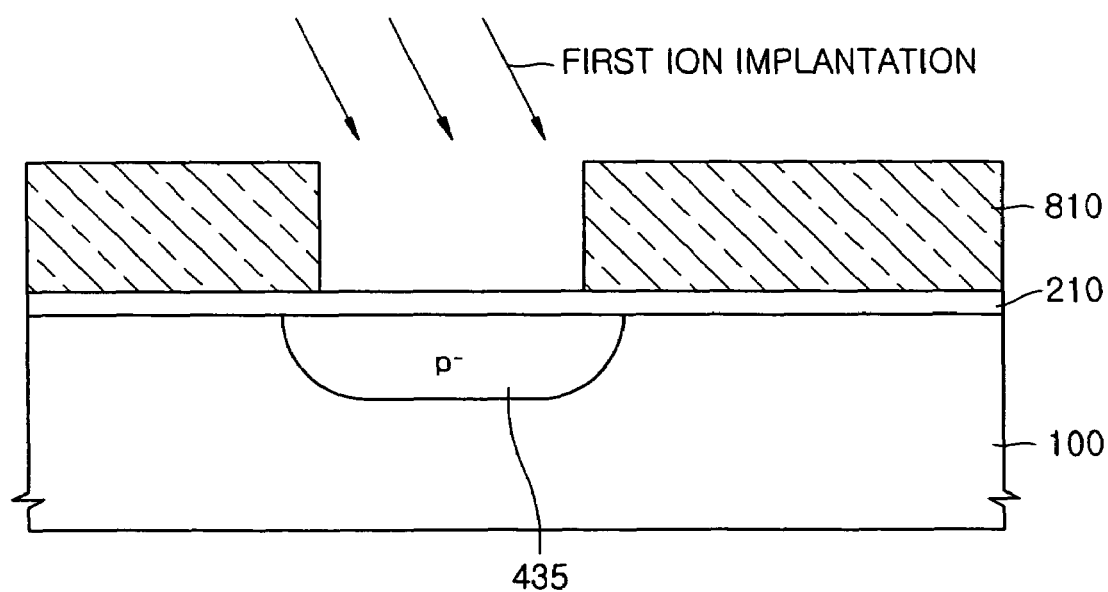
FIG. 6 is a cross-sectional view illustrating forming a second doped region on a semiconductor substrate according to an embodiment of the present invention.

FIG. 6 is a cross-sectional view illustrating an operation of forming a second doped region on a semiconductor substrate according to an embodiment of the present invention. Referring to FIG. 6, a first ion implantation mask 810 that exposes a portion of the semiconductor substrate 100 is formed on the gate dielectric layer 210. A p-type conductive dopant is ion-implanted into the portion of the semiconductor substrate 100 exposed by the first ion implantation mask 810.

The operation of implantation the first ion, that is, a p-type conductive dopant, such as boron, can be performed by a slope ion implantation. The second dopant region 435 doped with a p-type conductive dopant is formed on the semiconductor substrate 100 by the first ion implantation. For example, the second doped region 435 can be formed by ion implanting boron ion with a dose of from about $1.5E12/cm^2$ to about $2.0E13/cm^2$ at an energy of from about 50 to about 700 KeV. The ion acceleration energy and/or the dose in the first ion implantation process may vary according to the type of EEPROM device and ion implantation apparatus.

The opening region of the first ion implantation mask 810 is defined so that the second doped region 435 can be defined, as depicted in FIGS. 3 and 4, as the area overlapping the gates 250 and 270 of the memory transistor 200, to the extended region passing under the tunnel dielectric layer 230, and to the region overlapping gates 350 and 370 of the selection transistor 300.

Figure 7:
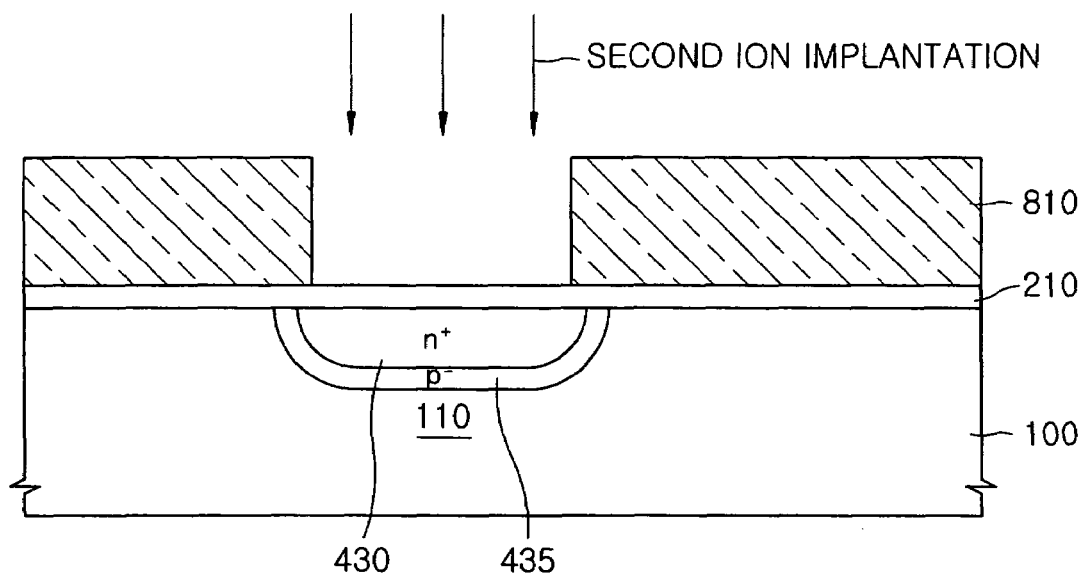
FIG. 7 is a cross-sectional view illustrating forming a first doped region on a semiconductor substrate according to an embodiment of the present invention.

FIG. 7 is a cross-sectional view illustrating the operation of forming a first doped region on a semiconductor substrate according to an embodiment of the present invention. Referring to FIG. 7, the operation of implanting a second ion, i.e., an n-type conductive dopant into the exposed portion of the semiconductor substrate 100, is performed using the first ion implantation mask 810.

The operation of implanting the second ion can be performed by implanting an n-type conductive dopant such as As ions or P ions. The first doped region 430 doped with such as an $n^+$ conductive dopant is formed on the semiconductor substrate 100 by implanting the second ion. At this time, as depicted in FIGS. 3 and 4, the first doped region 430 is defined in the region under and partially overlapping the gates 250 and 270 of the memory transistor 200, to the extended region passing under the tunnel dielectric layer 230, and to the region under and partially overlapping the gates 350 and 370 of the selection transistor 300.

The first doped region 430 formed by the second implantation is surrounded by the second doped region 435. The first doped region 430 may be formed by ion implanting P ions with a dose of from about 7.0E13 to about $1.0E14/cm^2$ at an energy of from about 50 to about 70 KeV, or As ions with a dose of from about 7.0E13 to about $1.5E14/cm^2$ at an energy of from about 60 to about 120 KeV. The dose and accelerating energy may vary according to the type of EEPROM device.

Figure 8:
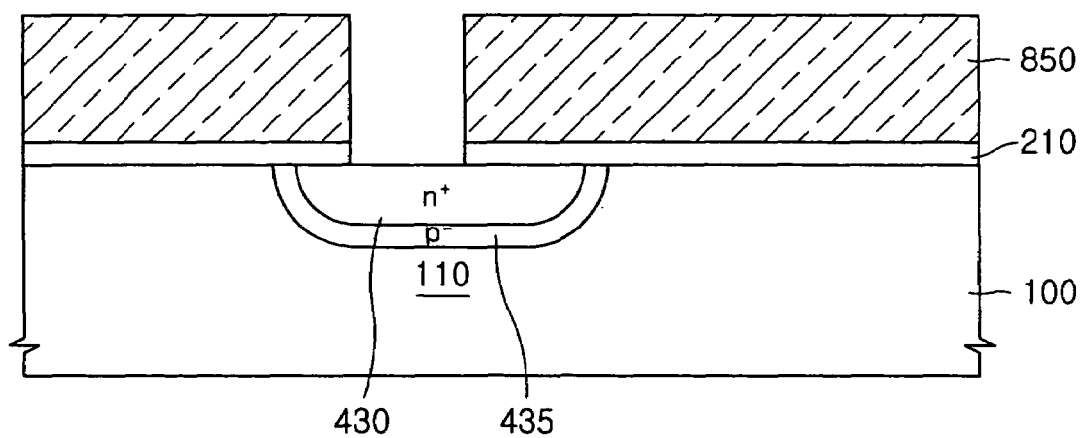
FIG. 8 is a cross-sectional view illustrating removing a portion of a gate dielectric layer on the first doped region according to an embodiment of the present invention.

FIG. 8 is a cross-sectional view illustrating an operation of removing a portion of a gate dielectric layer on the first doped region according to an embodiment of the present invention. Referring to FIG. 8, a portion of the gate dielectric layer 210 arranged on the first doped region 430 is removed by selective etching. For the selective etching, an etch mask 850 such as a photoresist pattern is formed, and a portion of the semiconductor substrate 100 under the gate dielectric layer 210 is exposed by selective etching the gate dielectric layer 210 exposed by the etch mask 850.

Figure 9:
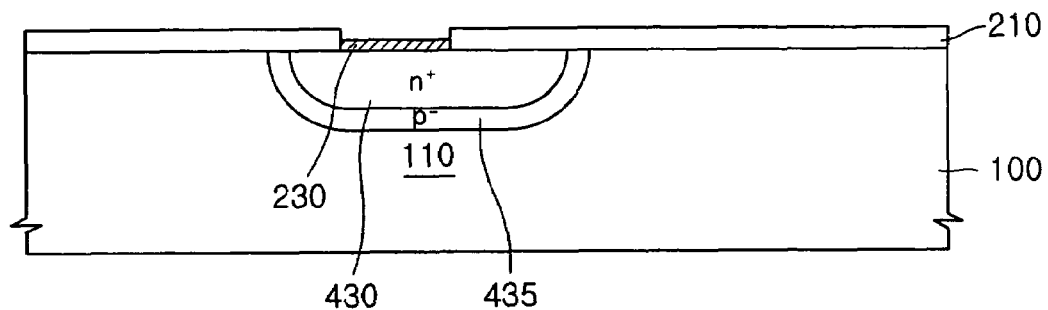
FIG. 9 is a cross-sectional view illustrating forming a relatively thin tunnel dielectric layer according to an embodiment of the present invention.

FIG. 9 is a cross-sectional view illustrating an operation of forming a relatively thin tunnel dielectric layer according to an embodiment of the present invention. Referring to FIG. 9, a dielectric layer, such as a silicon oxide layer, thinner than the gate dielectric layer 210, is formed on the exposed semiconductor substrate 100 as a portion of the gate dielectric layer 210 is selectively removed. The tunnel dielectric layer 230 can be formed to a thickness of from about 70 to about 80 Å

Figure 10:
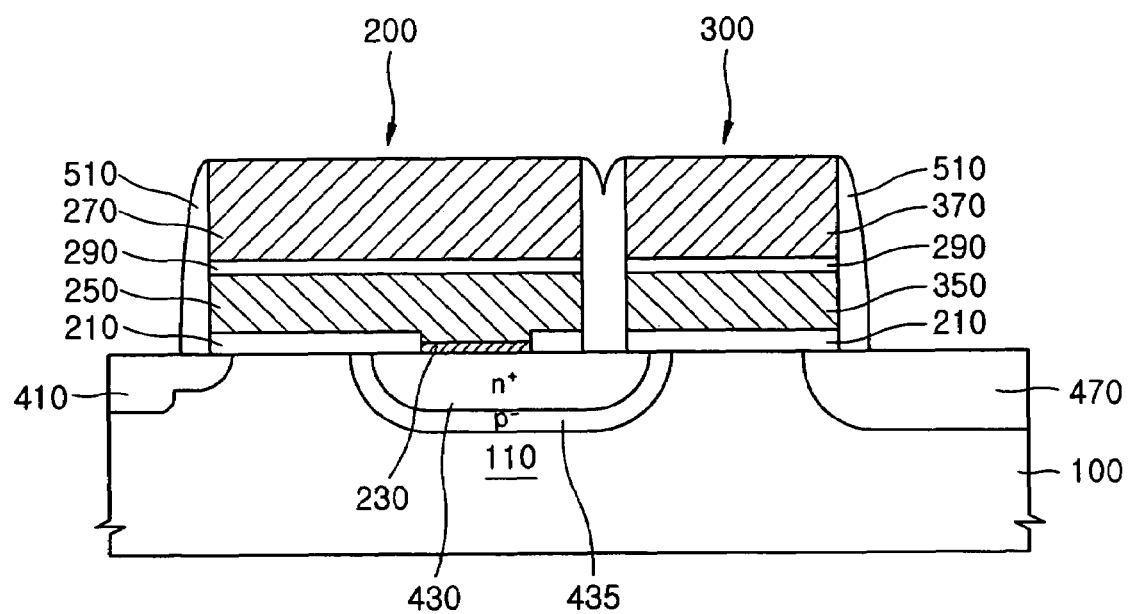
FIG. 10 is a cross-sectional view illustrating forming a source region and a drain region of transistors according to an embodiment of the present invention.

FIG. 10 is a cross-sectional view illustrating an operation of forming a source region and a drain region of transistors according to an embodiment of the present invention. Referring to FIG. 10, a first conductive layer for forming the floating gate 250 and the first gate 350 of the selection transistor 300 is formed on the entire surface of the semiconductor substrate 100 on which the gate dielectric layer 210 and the tunnel dielectric layer 230 are formed. The first conductive layer can be formed of a conductive layer such as a doped polysilicon layer. The first conductive layer can be formed to a thickness of from about 1000 to about 2000 Å.

At this time, the first conductive layer can be formed to a line pattern by patterning along the mask pattern 700 (in FIG. 3) for separating the floating gate so that the floating gate 250 can be separated into an island shape in the subsequent process for patterning the gate. The mask pattern 700 for separating the floating gate 250 is formed to pattern the floating gate 250 by a self aligning method.

An interlayer dielectric layer 290 is formed on the first conductive layer. The interlayer dielectric layer 290 can be formed of a high dielectric material such an oxide-nitride-oxide (ONO) layer. A second conductive layer for forming the control gate 270 and the control gate 370 of the selection transistor 300 is formed on the interlayer dielectric layer 290. The second conductive layer can be a conductive layer such as a doped polysilicon layer. The second conductive layer can be formed to a thickness of from about 1000 to about 2000 Å.

The first gate stack of the memory transistor 200, which includes the floating gate 250, the interlayer dielectric layer 290, and the control gate 270, is formed by sequentially patterning the second conductive layer, the interlayer dielectric layer 290, and the first conductive layer. The second gate stack of the selection transistor 300 includes the first gate 350, the interlayer dielectric layer 290, and the second gate 370.

Source region 410 is formed on a portion of the semiconductor substrate 100 adjacent to the first gate of the memory transistor 200 and opposite to the first doped region 430. Drain region 470 is formed on a portion of the semiconductor substrate 100 adjacent to the second gate of the selection transistor 300 and opposite to the first doped region 430.

The source region 410 can be formed by a lightly doped drain (LDD) structure composed of an $n^-$ dopant region formed by implanting As with a dose of from about 8.0E13 to about 8.0E14/cm$^2$ at an energy of from about 20 to about 30 KeV in a portion of p-type silicon substrate adjacent and aligning to the first gate stack of the memory transistor 200, and an $n^+$ dopant region formed by implanting As with a dose of from about 9.0E14 to about 9.0E15/cm$^2$ at an energy of from about 30 to about 80 KeV in a portion of p-type semiconductor substrate adjacent and aligning to the spacer 510.

The drain region 470 can be formed by an $n^-$ dopant region aligned to the second stack of the selection transistor 300. The drain region 470 can be formed by implanting P ions with a dose of from about 5.0E12 to about 1.2E13/cm$^2$ at an energy of from about 70 to about 120 KeV in a portion of the p-type semiconductor substrate 100. If the drain region 470 is formed to a double region structure such as a DDD region and the semiconductor substrate 100 is a p-type substrate, an $n^+$ dopant region may further be formed aligning the spacer 510 by implanting As ions with a dose of from about 9.0E14 to about 9.0E15/cm$^2$ at an energy of from about 30 to about 80 KeV.

The manufacture of the memory transistor 200 and the selection transistor 300 is carried out by forming the dopant regions 410 and 470 by ion implantation. Afterward, an insulating layer 550 (in FIG. 4) is formed to cover the memory transistor 200 and the selection transistor 300, and a bit line contact 610 as a conduit that connects to the drain region 470 through the insulating layer 550 and a bit line 650 that electrically connects to the bit line contact 610 are formed.

As described above, in the EEPROM device according to the present invention, a doped junction, that is, a floating junction, can be formed in a junction structure that includes a first dopant region doped with a first type conductive dopant and a second doped region doped with a second type conductive dopant. The second type conductor dopant is the opposite type to the first type conductive dopant, and formed to surround the first dopant region in an active region between the memory transistor and the selection transistor.

The problem of reducing the length of an effective channel due to cell size shrinkage can be solved by forming a junction structure that includes a first dopant region and a second dopant region doped with the opposite type conductive dopant to the first type dopant and formed to surround the first doped region. The second doped region may confine the thickness of a depletion layer generated from the first doped region and may suppress the propagation of the depletion layer. Therefore, the effective length of the channels of the memory transistor and the selection transistor can be increased.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. An EEPROM device comprising:
a first gate stack of a memory transistor formed on a semiconductor substrate;
a second gate stack of a selection transistor adjacent the first gate stack with a spacer therebetween on the semiconductor substrate;
a source region formed on a portion of the semiconductor substrate adjacent the first gate stack at a side opposite the second gate stack;
a drain region formed on a portion of the semiconductor substrate adjacent the second gate stack at a side opposite the first gate stack;
a floating junction region formed on an active region of the substrate and forming a channel of the memory transistor and/or the selection transistor, wherein the floating junction region is formed of:
a first doped region, one end of which is extended facing the drain region and the other end of which is extended facing the source region and located under the first gate stack and formed on the semiconductor substrate so as to be completely beneath the first gate stack, the spacer, and the second gate stack; and
a second doped region formed on the semiconductor substrate to surround the first doped region and being doped with an opposite conductivity type dopant than the first doped region and being located so as to be completely beneath the first gate stack, the spacer, and the second gate stack,
whereby a length of the effective channel of the memory transistor and/or the selection transistor is increased, wherein the first doped region is an $n^+$ dopant region, and wherein the second doped region is a $p^-$ dopant region that surrounds the $n^+$ dopant region.

2. The EEPROM device of claim 1, wherein both the source region and the drain region are doped with an n-type dopant.

3. An EEPROM device of comprising:
a first gate stack of a memory transistor that includes a tunnel dielectric layer formed on a semiconductor substrate, a gate dielectric layer that surrounds the tunnel dielectric layer, a floating gate formed on both the tunnel dielectric layer and the gate dielectric layer, and a control gate formed on the floating gate and an interlayer dielectric layer interposed therebetween;
a second gate stack of a selection transistor adjacent the first gate stack with a spacer therebetween on the semiconductor substrate;
a source region formed on a region of the semiconductor substrate and located adjacent the first gate stack on an opposite side to the second gate stack;
a drain region formed on the semiconductor substrate and located adjacent the second gate stack on an opposite side to the first gate stack;
a floating junction region formed on an active region of the substrate and forming a channel of the memory transistor and/or the selection transistor, wherein the floating junction region is formed of:

a first doped region, one end of which is extended facing the drain region and the other end of which is extended to a region toward the source region passing under the tunnel dielectric layer and formed on the semiconductor substrate to extend between the first gate stack and the second gate stack; and a second doped region formed on the semiconductor substrate to surround the first doped region and being doped with the opposite conductive type dopant to the first doped region and being located so as to be completely beneath the first gate stack, the spacer, and the second gate stack, whereby a length of the effective channel of the memory transistor and/or the selection transistor is increased, wherein the first doped region is an n$^+$ dopant region, and wherein the second doped region is a p$^-$ dopant region that surrounds the n$^+$ dopant region.

4. The EEPROM device of claim 3, wherein the tunnel dielectric layer is thinner than the gate dielectric layer.

5. The EEPROM device of claim 3, wherein the second gate stack of the selection transistor comprises:

a second gate dielectric layer formed at substantially the same time as the gate dielectric layer;

a first gate formed at substantially the same time as the floating gate on the second gate dielectric layer; and a second gate formed at substantially the same time as the control gate on the first gate by forming a second interlayer dielectric layer between the first gate and the second gate.

6. An EEPROM device which is composed of one cell comprising a memory transistor in series with and separated by a spacer from a selection transistor on a semiconductor substrate, and includes a source region located on a side of the memory transistor, a drain region located on a side of the selection transistor opposite to the memory transistor, and a floating junction region formed on the semiconductor substrate between the memory transistor and the selection transistor and forming a channel of the memory transistor and/or the selection transistor, wherein the floating junction region includes a first doped region extended toward the source region under a region occupied by the memory transistor so as to be completely beneath the memory transistor, the spacer, and the selection transistor and a second doped region doped with the opposite conductivity type dopant than the first doped region and formed to surround the first doped region and being located so as to be completely beneath the memory transistor, the spacer, and the selection transistor, whereby a length of the effective channel of the memory transistor and/or the selection transistor is increased, wherein the first doped region is an n$^+$ dopant region, and wherein the second doped region is a p$^-$ dopant region that surrounds the n$^+$ dopant region.

7. The EEPROM device of claim 6, wherein, the memory transistor includes a tunnel dielectric layer formed on the semiconductor substrate, a gate dielectric layer that surrounds the tunnel dielectric layer, a floating gate formed on both the tunnel dielectric layer and the gate dielectric layer, and a control gate formed on the floating gate and an interlayer dielectric layer interposed therebetween, and the floating junction region includes a first doped region extended toward the source region to a region passing under the tunnel dielectric layer.

8. An EEPROM device comprising:

a first gate stack of a memory transistor formed on a semiconductor substrate;

a second gate stack of a selection transistor adjacent the first gate stack with a spacer therebetween on the semiconductor substrate;

a source region formed on a portion of the semiconductor substrate adjacent the first gate stack at a side opposite the second gate stack;

a drain region formed on a portion of the semiconductor substrate adjacent the second gate stack at a side opposite the first gate stack;

a floating junction region formed on an active region of the substrate and forming a channel of the memory transistor and/or the selection transistor, wherein the floating junction region is formed of:

a first doped region, one end of which is extended facing the drain region and the other end of which is extended facing the source region and located under the first gate stack and formed on the semiconductor substrate so as to be completely beneath the first gate stack, the spacer, and the second gate stack; and a second doped region formed on the semiconductor substrate to surround the first doped region and being doped with an opposite conductivity type dopant than the first doped region and being located so as to be completely beneath the first gate stack, the spacer, and the second gate stack; and a bit line connected to the drain region over the first gate stack of the memory transistor and the second gate stack of the selection transistor.

* * * * *